(12) United States Patent
Lee

(10) Patent No.: US 8,507,973 B2
(45) Date of Patent: Aug. 13, 2013

(54) NON-VOLATILE MEMORY DEVICE AND METHOD FOR FABRICATING THE SAME

(75) Inventor: Byung-In Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 31 days.

(21) Appl. No.: 13/329,945

(22) Filed: Dec. 19, 2011

(65) Prior Publication Data

US 2012/0299005 A1 Nov. 29, 2012

(30) Foreign Application Priority Data

May 26, 2011 (KR) .................. 10-2011-0050040

(51) Int. Cl.
*H01L 29/792* (2006.01)
(52) U.S. Cl.
USPC .................................. 257/324; 257/E29.309
(58) Field of Classification Search
USPC ......................................................... 257/324
See application file for complete search history.

(56) References Cited

U.S. PATENT DOCUMENTS

| 2009/0090959 | A1* | 4/2009 | Nishihara et al. | 257/324 |
| 2009/0173981 | A1* | 7/2009 | Nitta | 257/302 |
| 2011/0193153 | A1* | 8/2011 | Higuchi et al. | 257/324 |
| 2012/0168858 | A1* | 7/2012 | Hong | 257/330 |

FOREIGN PATENT DOCUMENTS

| KR | 10-2008-0113468 | 12/2008 |
| KR | 10-2010-0013964 | 2/2010 |

* cited by examiner

*Primary Examiner* — Thien F Tran
(74) *Attorney, Agent, or Firm* — IP & T Group LLP

(57) ABSTRACT

A non-volatile memory device includes a channel that extends from a substrate in a vertical direction and includes a first portion including an impurity doped region and a second portion disposed under the first portion; and a plurality of memory cells and a selection transistor that are stacked over the substrate along the channel, where the impurity doped region includes a second impurity doped region that forms a side surface and an upper surface of the first portion and a first impurity doped region that covers the second impurity doped region, and a bandgap energy of the second impurity doped region is lower than a bandgap energy of the first impurity doped region.

11 Claims, 10 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2011-0050040, filed on May 26, 2011, which is incorporated herein by reference in its entirety.

BACKGROUND

1. Field

Exemplary embodiments of the present invention relate to a non-volatile memory device, and a fabrication method thereof, and more particularly, to a non-volatile memory device having a three-dimensional (3D) structure where a plurality of memory cells are stacked perpendicularly to a substrate, and a method for fabricating the non-volatile memory device.

2. Description of the Related Art

A non-volatile memory device is a memory device that retains data stored therein even if a power supply is cut off. Diverse non-volatile memory devices such as a flash memory are available.

As the integration degree of a memory device having a two-dimensional structure where memory cells are formed in a single layer over a substrate is reaching physical limits, a non-volatile memory device having a three-dimensional (3D) structure where a plurality of memory cells are stacked along the channels extending from a silicon substrate in a vertical direction and selection transistors are disposed in the upper or lower portions of the memory cells is being developed.

As to the two-dimensional non-volatile memory device, it performs an erase operation where holes are supplied to channels by applying an erase voltage to substrate bodies. As to the three-dimensional non-volatile memory device, while it has channels formed in the shape of pillars extending from a substrate, the three-dimensional non-volatile memory device does not have the layer corresponding to the substrate bodies in the two-dimensional non-volatile memory device. Here, the three-dimensional non-volatile memory device does not perform an erase operation by applying an erase voltage to substrate bodies.

Instead, the three-dimensional non-volatile memory device may perform the erase operation by using selection transistors and causing Gate Induced Drain Leakage (GIDL) to supply holes to the channels.

However, when an erase operation is performed based on the GIDL method, it is difficult to generate a sufficient amount of holes for performing the erase operation because a GIDL occurring region is limited to an area adjacent to a gate edge of a selection transistor. Therefore, it is hard to sufficiently supply holes to channels and accordingly, the speed of an erase operation may deteriorate. Such a feature becomes even more pronounced as the channels become longer.

SUMMARY

An embodiment of the present invention is directed to a non-volatile memory device that may generate a sufficient amount of holes needed for an erase operation so as to improve the speed of an erase operation and a method for fabricating the non-volatile memory device.

In accordance with an embodiment of the present invention, a non-volatile memory device includes: a channel that extends from a substrate in a vertical direction and includes a first portion including an impurity doped region and a second portion disposed under the first portion; and a plurality of memory cells and a selection transistor that are stacked over the substrate along the channel, wherein the impurity doped region includes a second impurity doped region that forms a side surface and an upper surface of the first portion and a first impurity doped region that covers the second impurity doped region.

In accordance with another embodiment of the present invention, a method for fabricating a non-volatile memory device includes: providing a substrate structure including a plurality of memory cells and a selection transistor that are stacked over a substrate along a channel that extends from the substrate in a vertical direction and includes a first portion and a second portion disposed under the first portion; exposing an upper portion of the channel; forming a first impurity doped region by doping the first portion of the channel with a first impurity; and forming a second impurity doped region by doping a surface of the impurity-doped first portion with a second impurity.

DETAILED DESCRIPTION

Figure 1:
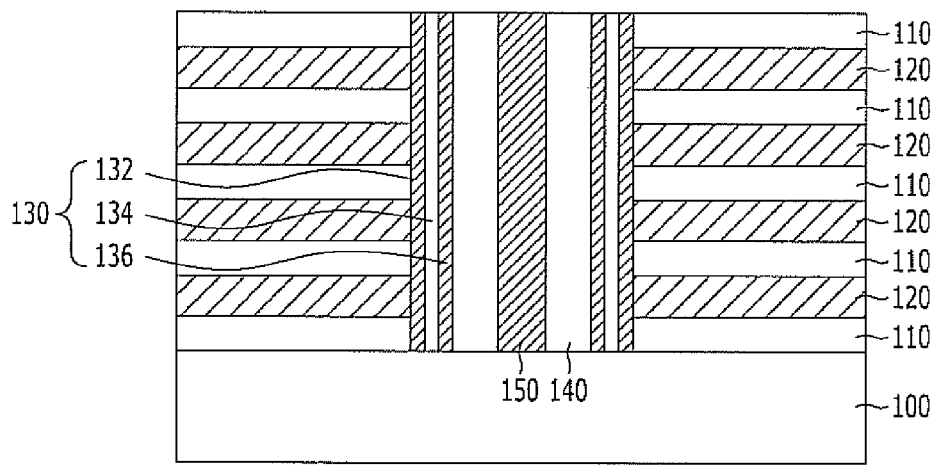
FIGS. 1 to 6 are cross-sectional views illustrating a non-volatile memory device and a method for fabricating the non-volatile memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1 to 6 are cross-sectional views illustrating a non-volatile memory device and a method for fabricating the non-volatile memory device in accordance with an embodiment of the present invention.

Referring to FIG. 1, first inter-layer dielectric layers 110 and first conductive layers 120 are alternately stacked over a substrate 100 that may include other preformed structures.

The first conductive layers 120 are used as control gate electrodes of a plurality of memory cells in the non-volatile memory device in accordance with the embodiment of the present invention, and the first conductive layers 120 may include polysilicon. The first inter-layer dielectric layers 110 are layers for isolating the first conductive layers 120 from each other and may be formed of oxide layers.

While first conductive layers 120 are shown, the exemplary embodiment of the present invention is not limited thereto and may be modified to have different numbers of stacked first conductive layers 120.

Subsequently, a channel hole that exposes the substrate 100 are formed by selectively etching a stacked structure of the first inter-layer dielectric layers 110 and the first conductive layers 120, a memory layer 130 is formed on the sidewall/internal wall of the channel hole, and a first channel 140 contacting the sidewall/internal wall of the memory layer 130 is formed within the channel hole where the memory layer 130 is formed.

In this embodiment of the present invention, the first channel 140 has a shape of a pipe having a hollow space internally. While the hollow space may be filled with a first insulation layer 150 as shown, the first channel 140 may also have a pillar shape to completely fill the channel hole where the memory layer 130 is formed without having the first insulation layer 150 formed therein.

The memory layer 130 may have a triple-layer structure where a charge blocking layer 132, a charge trapping layer 134, and a tunnel insulation layer 136 are sequentially disposed on the sidewall of the channel hole. For example, the memory layer 130 may be of an ONO (oxide-nitride-oxide) layer. The first channel 140 may include a polycrystalline semiconductor material, such as polysilicon. The first insulation layer 150 may be an oxide layer.

As a result of the process shown in FIG. 1, a plurality of memory cells are stacked along the first channels 140 in a vertical direction. Each memory cell includes the memory layer 130 contacting the first channel 140 and one of the first conductive layers 120, and the memory cells are isolated from each other by the first inter-layer dielectric layers 110.

Figure 2:
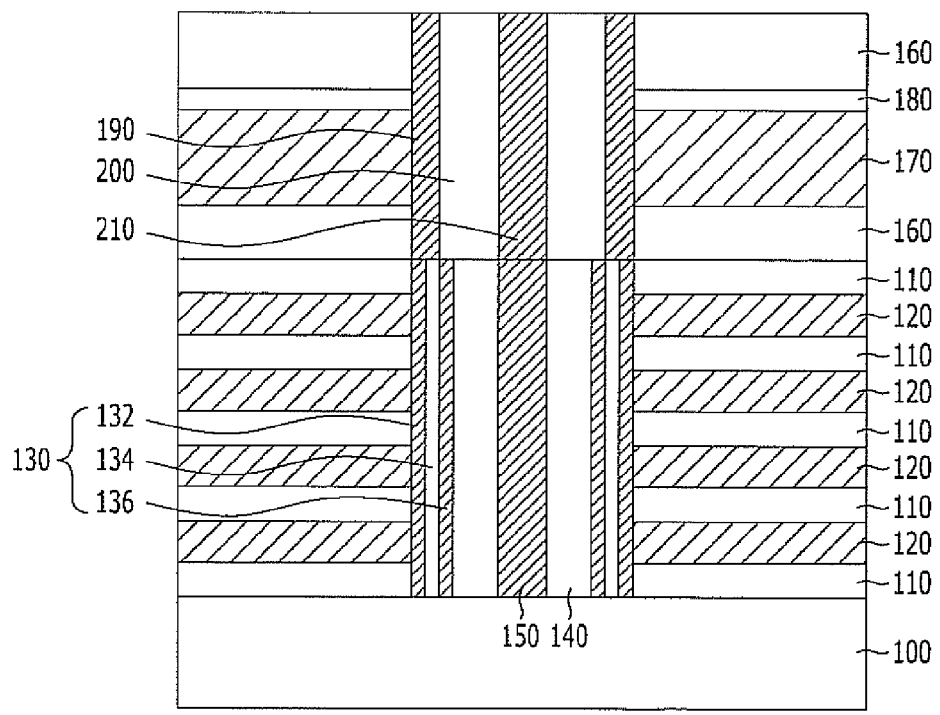

Referring to FIG. 2, a second inter-layer dielectric layer 160, a second conductive layer 170, an anti-ion implantation layer 180, and a second inter-layer dielectric layer 160 are sequentially formed over the substrate structure obtained as a result of the process shown in FIG. 1.

The second conductive layer 170 is used as a gate electrode of a selection transistor disposed over memory cells in the non-volatile memory device in this embodiment of the present invention. The second conductive layer 170 may include polysilicon. The second inter-layer dielectric layer 160 is a layer for isolating the second conductive layer 170 from the upper and lower layers and the second inter-layer dielectric layer 160 may be an oxide layer. The anti-ion implantation layer 180 disposed over the second conductive layer 170 inhibits impurity from being implanted into the second conductive layer 170 in an impurity ion implantation process (see FIGS. 3 and 4), which is to be described later. The anti-ion implantation layer 180 may include a material having a different etch rate from the etch rate of the second inter-layer dielectric layer 160 and may be a silicon nitride, a silicon oxynitride, etc.

Subsequently, a channel hole that expose the first channel 140 and the memory layer 130 surrounding the first channel 140 is formed by selectively etching the stacked structure where the second inter-layer dielectric layer 160, the second conductive layer 170, the anti-ion implantation layer 180, and the second inter-layer dielectric layer 160 are sequentially stacked. Subsequently, a gate insulation layer 190 is formed on the sidewall of the channel hole, and second channel 200 contacting the sidewall of the gate insulation layer 190 is formed in the channel hole where the gate insulation layer 190 is formed.

In this embodiment of the present invention, the second channel 200 has a shape that is substantially the same as the first channel 140, that is, the shape similar to a pipe having a hollow space within, and the hollow space is filled with a second insulation layer 210. According to another example, the second channel 200 may have a pillar shape to completely fill the channel hole where the gate insulation layer 190 is formed without having the second insulation layer 210 formed therein.

The gate insulation layer 190 may be a gate oxide layer. The second channel 200 may include a polycrystalline semiconductor material, e.g., polysilicon. The second insulation layer 210 may be an oxide layer.

As a result of the process shown in FIG. 2, a selection transistor is formed over the memory cells, and the second channel 200 of the selection transistor may be integrated with the first channel 140 disposed under the selection transistor.

While, according to the processes shown in FIGS. 1 and 2, the memory cells are formed to be stacked along the first channel 140 and the selection transistor including the second channel 200 coupled with the first channel 140 is formed over the memory cells, the exemplary embodiment of the present invention are not limited thereto, and where one or more steps/features may be changed/varied/switched.

For example, one channel penetrating the first inter-layer dielectric layers 110, the first conductive layers 120, the second inter-layer dielectric layer 160, and the second conductive layer 170 may be formed by forming a stacked structure including the first inter-layer dielectric layers 110 and the first conductive layers 120 first and subsequently forming a stacked structure including the second inter-layer dielectric layer 160 and the second conductive layer 170 over the stacked structure including the first inter-layer dielectric layers 110 and the first conductive layers 120, forming a channel hole in the resulting structure by selectively etching the first inter-layer dielectric layers 110, the first conductive layers 120, the second inter-layer dielectric layer 160, and the second conductive layer 170, and performing a process for forming the memory layer and the channel in the structure where the channel hole is formed. In this case, the memory layer may be interposed not only between the first conductive layer 120 and the channel but also between the second conductive layer 170 and the channel as well, where the memory layer interposed between the second conductive layer 170 and the channel may function as a gate insulation layer.

Figure 3:
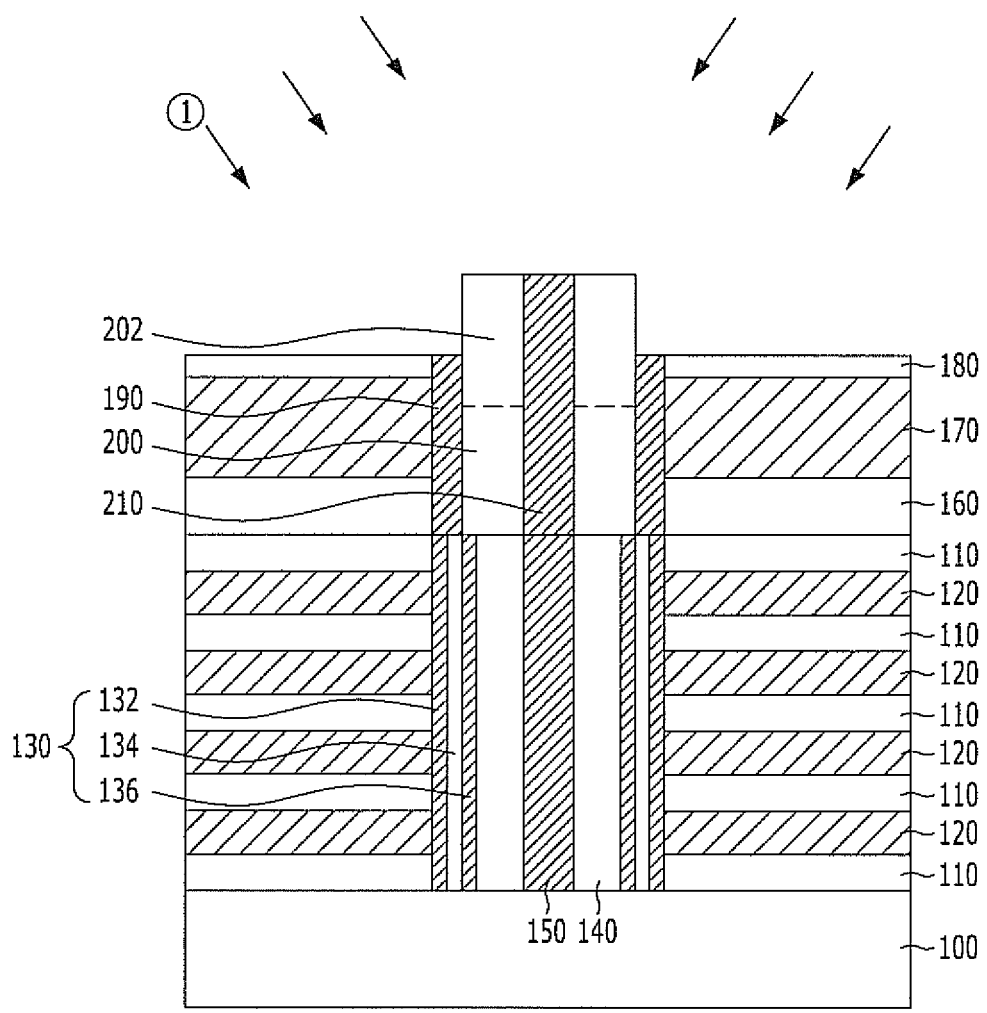

Referring to FIG. 3, the second inter-layer dielectric layer 160 disposed in the uppermost layer is removed. Here, since the gate insulation layer 190 is formed of substantially the same material as that of the second inter-layer dielectric layer 160, such as a gate oxide layer, the gate insulation layer 190 portion that is exposed as the uppermost second inter-layer dielectric layer 160 is subsequently removed may be removed together at the same time. Here, the anti-ion implantation layer 180 is not removed by forming the anti-ion implantation layer 180 with a material having a different etch rate from that of the second inter-layer dielectric layer 160.

The process of removing the second inter-layer dielectric layer 160 may be performed through a wet etch process or a dry etch process that uses the anti-ion implantation layer 180 as an etch stop layer.

As a result of removing the top second inter-layer dielectric layer 160, a portion of the second channel 200 is exposed to protrude over the anti-ion implantation layer 180.

Subsequently, an initial first impurity doped region 202 is formed by doping the upper portion of the second channel 200 with a first impurity by performing a first ion implantation process (refer to an arrow mark ①).

Here, the first ion implantation process is performed so that the bottom surface of the initial first impurity doped region 202 is close in depth to the upper surface of the second conductive layer 170, where the second conductive layer 170 is used as a gate of the selection transistor. While the bottom surface of the initial first impurity doped region 202 is shown to be a little lower than the upper surface of the second conductive layer 170, the height of the bottom surface of the initial first impurity doped region 202 may be adjusted as appropriate according to different design needs. Here, the bottom surface extends across one side of a channel region formed under a gate of the selection transistor formed by the second conductive layer 170 without extending over to the opposite side of the channel region. Also, the first impurity used for the first ion implantation process may be a high-concentration N-type impurity, such as arsenic (As).

The first ion implantation process is performed to increase the speed of an erase operation. Since the non-volatile memory device according to the embodiment of the present invention performs an erase operation using Gate Induced Drain Leakage (GIDL) of the selection transistor, increasing the GIDL increases the speed of an erase operation. Since the GIDL is mostly caused in an area adjacent to a gate edge of the selection transistor that is disposed closer to a drain (refer to a reference sign 'A' of FIG. 6), the GIDL may increase as the doping concentration of the impurity in the area adjacent to the gate edge of the selection transistor that is disposed closer to a drain in the channel is higher.

Therefore, the occurrence of the GIDL during an erase operation may be increased by forming the initial first impurity doped region 202 doped with the high-concentration impurity through the first ion implantation process, where the bottom surface of the initial first impurity doped region 202 is close to the upper surface of the second conductive layer 170.

Subsequently, a thermal treatment is performed to activate the doped impurity used in the first ion implantation process. The energy applied during the first ion implantation process may turn the upper portion of the second channel 200, which corresponds to the initial first impurity doped region 202, into an amorphous form temporarily, where the upper portion of the second channel 200 re-crystallizes.

Figure 4:
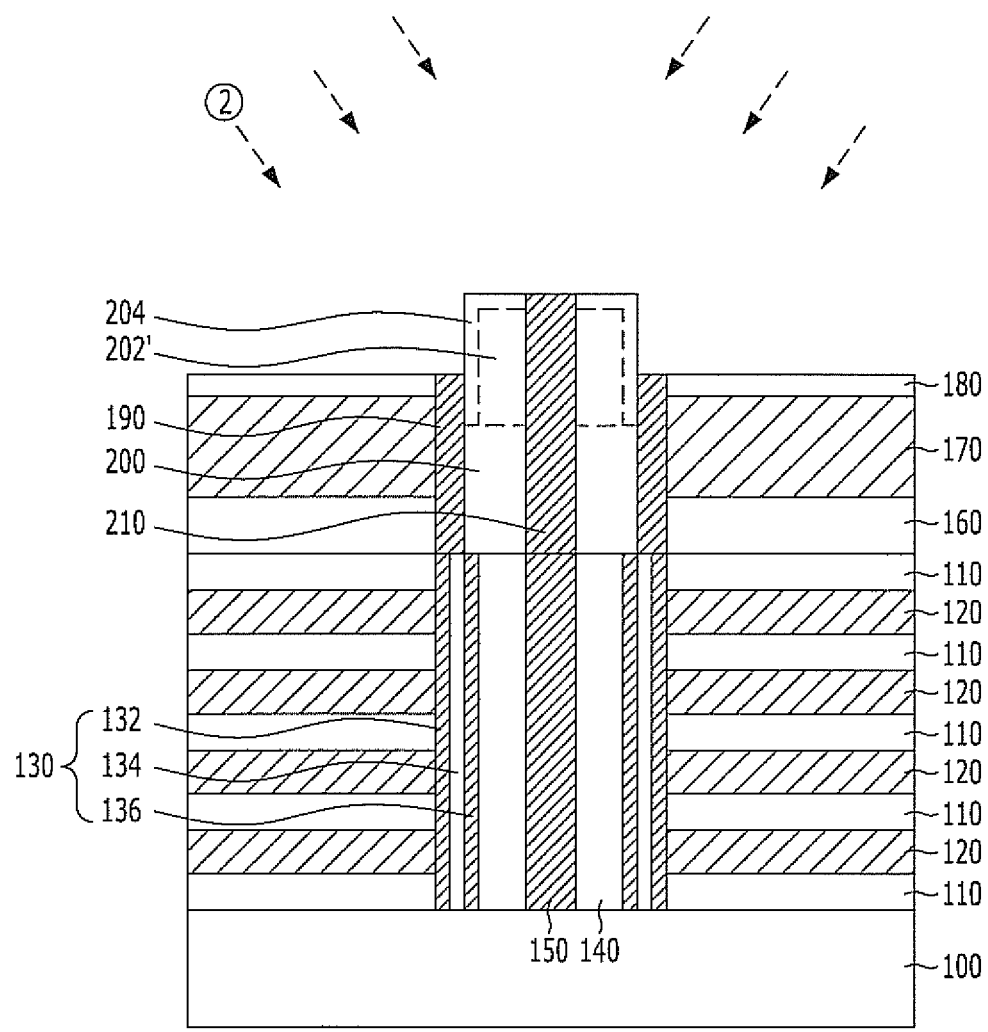

Referring to FIG. 4, a second ion implantation process (refer to an arrow mark ②) is performed onto the substrate structure including the initial first impurity doped region 202 formed therein, where the second ion implantation penetrates to a shallow depth. By performing the second ion implantation process, a second impurity doped region 204 is formed at the surfaces of the upper portion of the second channel 200, which include the side and upper surfaces of the upper portion of the second channel 200. As a result, the initial first impurity doped region 202 has a surface portion that is further doped with a second impurity, which is referred to as a second impurity doped region 204, and a portion that surrounds the second impurity doped region 204 and is not doped with the second impurity. The portion that is not doped with the second impurity is referred to as a final first impurity doped region 202'.

Here, the second impurity doped region 204 that is doped with the second impurity during the second ion implantation process may have a lower bandgap energy than a polycrystalline semiconductor material that constitutes the second channel 200. For instance, when the second channel 200 is formed of polysilicon, the second impurity may be germanium (Ge). Therefore, the second impurity doped region 204 has a lower bandgap energy than the final first impurity doped region 202'.

After the second ion implantation process, the thermal treatment that is performed after the first ion implantation process is not performed. Therefore, the surface portion of the upper portion of the second channel 200 that corresponds to the second impurity doped region 204 has an amorphous state due to the energy applied during the second ion implantation process, where the amorphous state is more advanced in comparison to the portion of the second channel 200 that corresponds to the final first impurity doped region 202'.

By performing the second ion implantation process while not performing a thermal treatment after the second ion implantation, the speed of an erase operation even faster. Here, since the surface portion of the upper portion of the second channel 200 that corresponds to the second impurity doped region 204 has a relatively low bandgap energy and an amorphous state, a Band-to-Band Tunneling (BTBT) effect and a Trap-Assisted Tunneling (TAT) effect occur extensively and increases GIDL so as to lead to a faster erase operation speed. These effects will be described later in detail by referring to FIG. 7.

Figure 5:
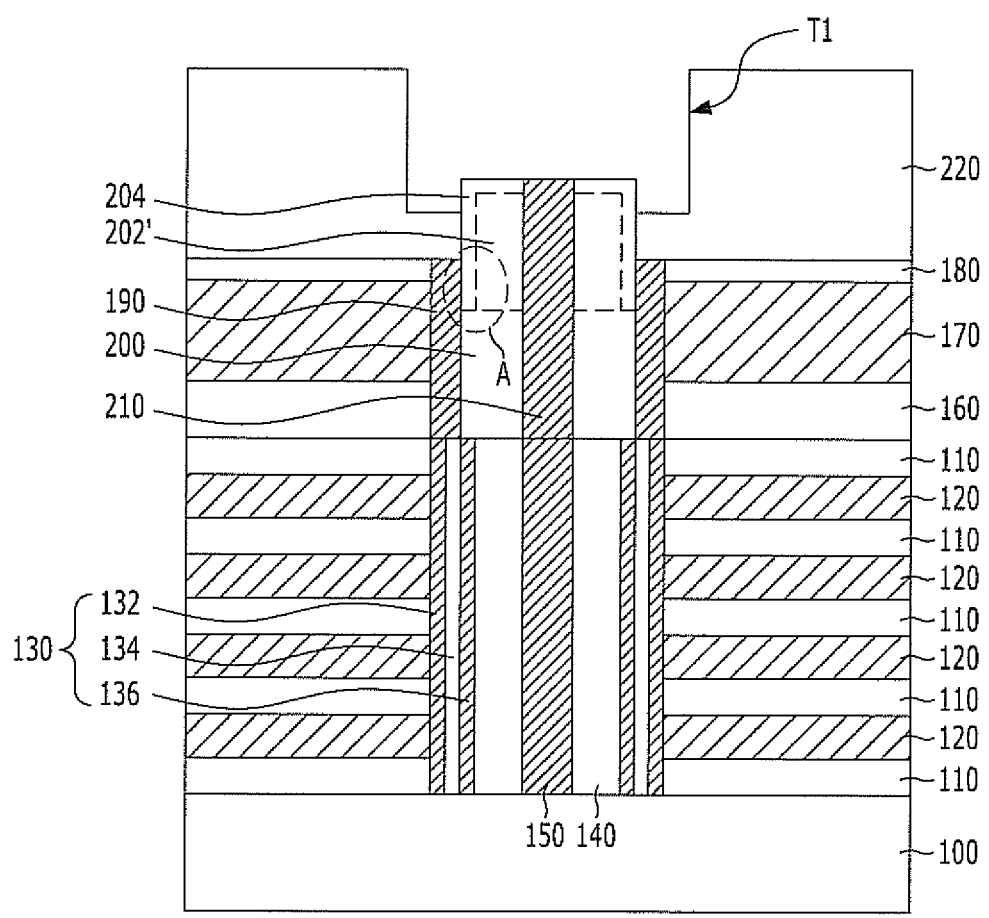

Referring to FIG. 5, a third inter-layer dielectric layer 220 covering the substrate structure obtained from the process of FIG. 4 is formed. The third inter-layer dielectric layer 220 may be an oxide layer.

Subsequently, a trench T1 that exposes the second channel 200 is formed by selectively etching the third inter-layer dielectric layer 220. The trench T1 is disposed over the second channel 200 and defines a region where a conductive pattern such as a line or a contact for contacting the second channel 200 is to be formed.

Here, the etching of the third inter-layer dielectric layer 220 for forming the trench T1 is an over-etch process that exposes not only the upper surface of the second channel 200 but also the external side surfaces of the second channel 200 to a desired depth from the upper surface of the second channel 200. Here, the over-etch process decreases the contact resistance by increasing the contact area between the conductive pattern, which is to be described later, and the second channel 200.

Figure 6:
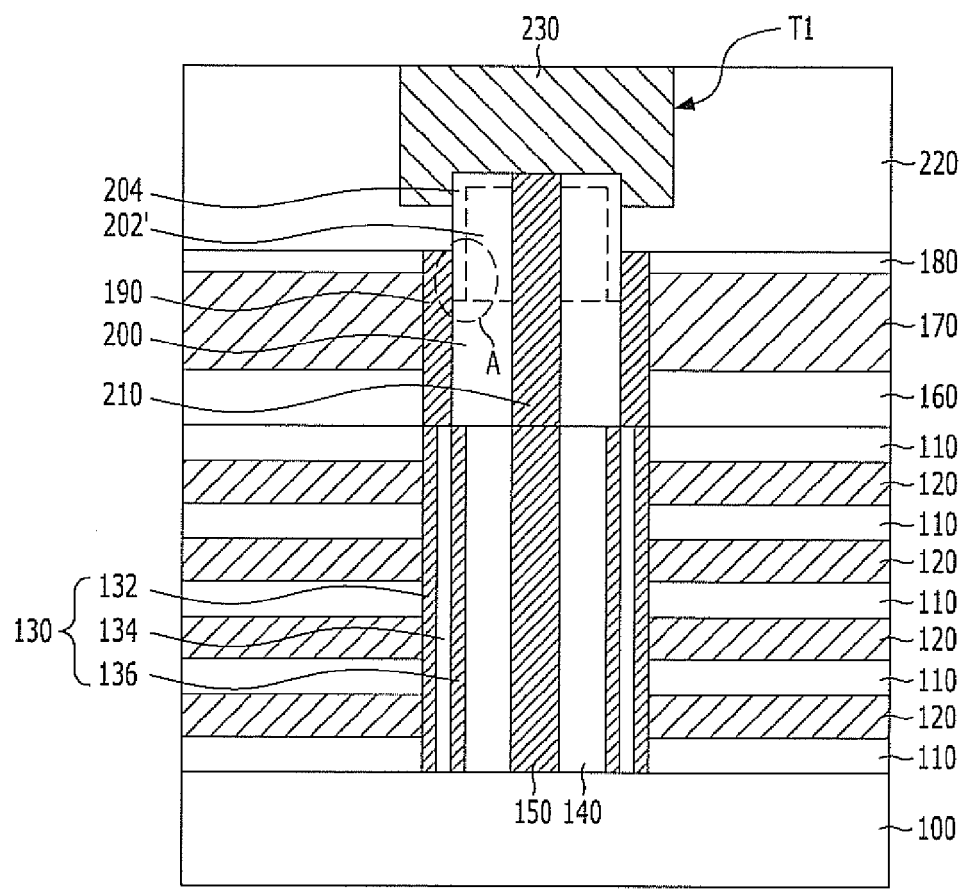

Referring to FIG. 6, a conductive pattern 230 is formed by filling the trench T1 with a conductive material, which is metal such as tungsten. As described above, the conductive pattern 230 may be a line such as a source line, or it may be a contact such as a bit line contact. Also, since the conductive pattern 230 contacts not only the upper surface of the second channel 200 but also a portion of an external side surface thereof, contact resistance is decreased.

The non-volatile memory device illustrated in FIG. 6 may be fabricated through the above-described fabrication process. Hereafter, the effect of the non-volatile memory device according to an embodiment of the present invention is described in detail with reference to FIGS. 6 and 7.

Figure 7:
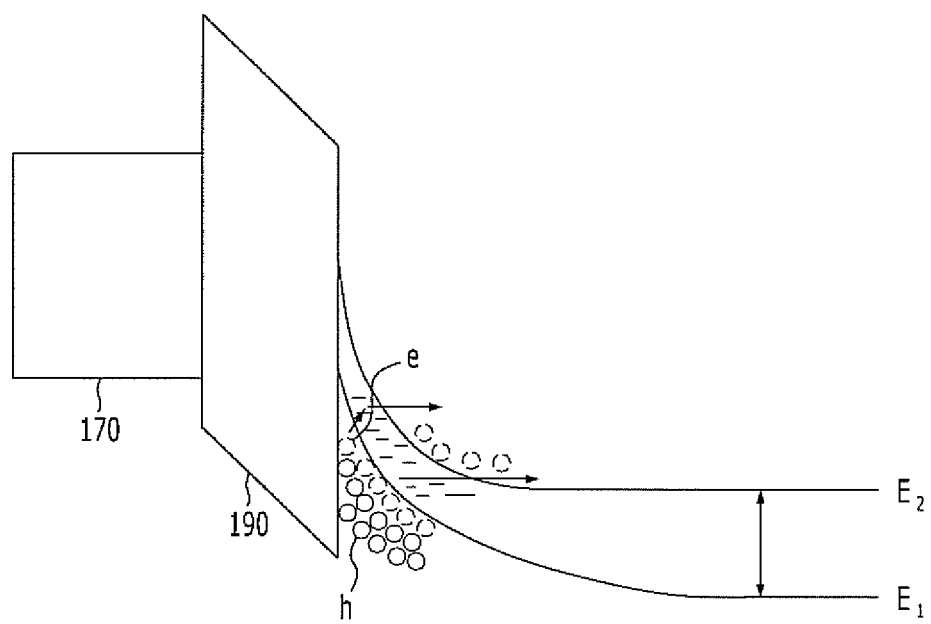
FIG. 7 illustrates the effect of a non-volatile memory device in accordance with an embodiment of the present invention.

FIG. 7 illustrates the effect of a non-volatile memory device in accordance with an embodiment of the present invention.

Referring to FIGS. 6 and 7, the upper portion (that is, the final first impurity doped region 202' and the second impurity doped region 204) of the second channel 200 has the bottom surface adjacent to the upper surface of the second conductive layer 170, which is a gate of an upper selection transistor. In this state, since GIDL occurs in a channel portion (see a reference symbol 'A' of FIG. 6) contacting an edge of the second conductive layer 170 close to a drain of the upper selection transistor, the channel portion A is referred to as a GIDL occurring region.

Since the final first impurity doped region 202' and the second impurity doped region 204 are doped with a high-concentration impurity, the concentration of the impurity in the GIDL occurring region A is high as well to increase GIDL and thus the speed of an erase operation.

Also, since the bandgap energy (refer to a reference symbol 'E1' of FIG. 7) of the second impurity doped region 204 that constitutes the surface portion of the upper portion of the second channel 200 is lower than the bandgap energy (refer to a reference symbol 'E2' of FIG. 7) of the final first impurity doped region 202' that constitutes the remaining portion of the upper portion of the second channel 200, a Band-to-Band Tunneling (BTBT) effect occurs increasingly under the gate insulation layer 190 adjacent to the edge of the second conductive layer 170 close to a drain, where the second conductive layer 170 is used for the selection transistor. The increased BTBT effect signifies that the tunneling of electrons (e) is increased and accordingly, lots of holes (h) are generated. Thus, the GIDL and the speed of an erase operation may increase.

Here, when the second impurity doped region 204 that constitutes the surface portion of the upper portion of the second channel 200 is in an amorphous state that is more advanced in comparison to the remaining portion of the upper portion of the second channel 200, the second impurity doped region 204 may include defects and a Trap-Assisted Tunneling (TAT) may increase due to the electrons trapped by the defects. The increased TAT signifies that the number of electron (e)-hole (h) pairs that may cause the GIDL and the speed of an erase operation to increase.

Meanwhile, the above-described embodiment may be applied to three-dimensional non-volatile memory devices of diverse structures and a fabrication method thereof. Here, the three-dimensional non-volatile memory devices of diverse structures may be any three-dimensional non-volatile memory device as long as the non-volatile memory device has channels extending perpendicularly to a substrate and a plurality of memory cells that are stacked along the channels. Hereafter, the non-volatile memory device is exemplarily described with reference to FIGS. 8 to 11.

FIGS. 8 to 11 are cross-sectional views illustrating a non-volatile memory device and a method for fabricating the non-volatile memory device in accordance with another embodiment of the present invention. Any description of features that overlap with those of the previous embodiment may be omitted hereinafter.

Figure 8:
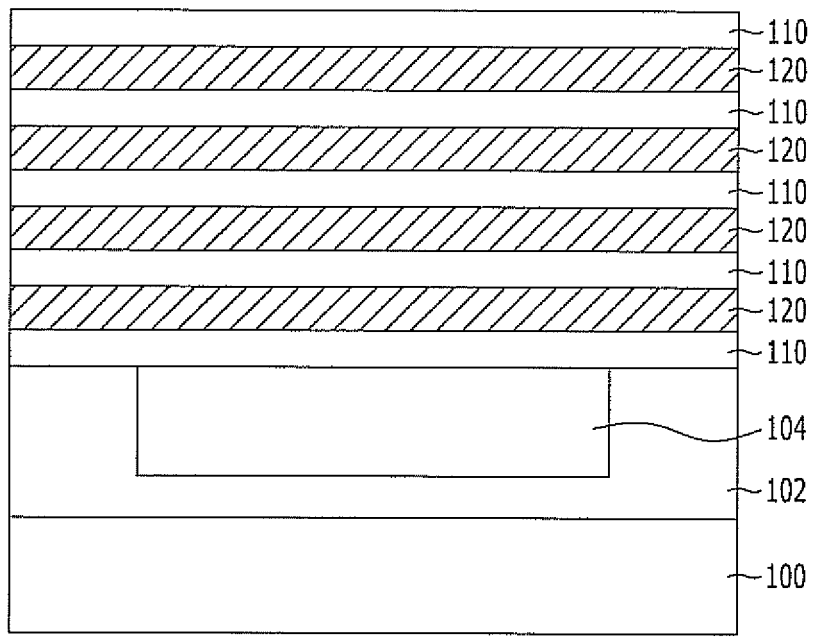
FIGS. 8 to 11 are cross-sectional views illustrating a non-volatile memory device and a method for fabricating the non-volatile memory device in accordance with another embodiment of the present invention.

Referring to FIG. 8, a pipe gate electrode layer 102 filled with a sacrificial layer 104 is formed over a substrate 100 before a stacked structure of first inter-layer dielectric layers 110 and a first conductive layer 120 is formed.

The pipe gate electrode layer 102 is a gate electrode of a pipe transistor, which will be described later. The pipe gate electrode layer 102 may be a polysilicon layer doped with an impurity. The sacrificial layer 104 defines a region where a channel of the pipe transistor is to be formed, and the sacrificial layer 104 may be an insulation layer, such as an oxide layer and a nitride layer.

Subsequently, the stacked structure where the first inter-layer dielectric layers 110 and the first conductive layer 120 are alternately stacked is formed over the pipe gate electrode layer 102 filled with the sacrificial layer 104.

Figure 9:
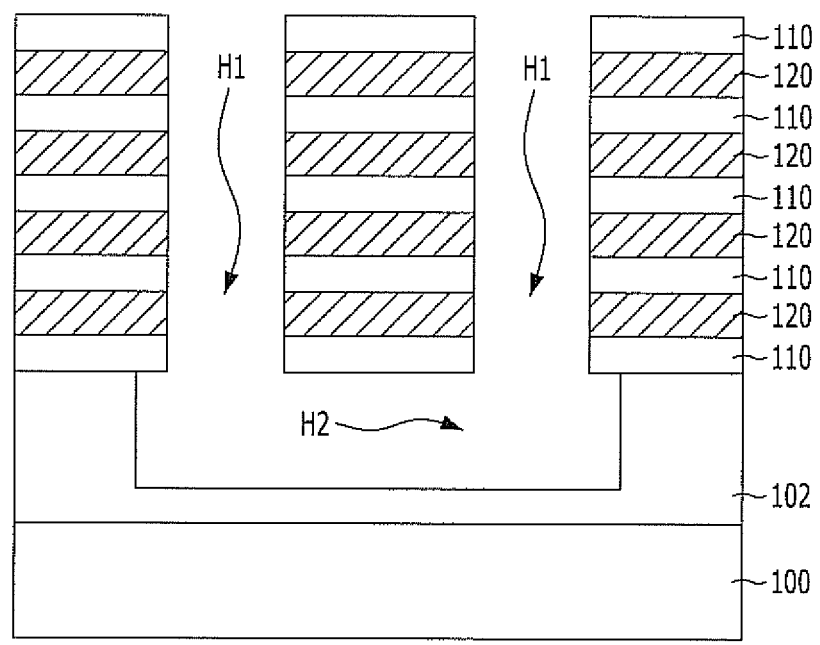

Referring to FIG. 9, a pair of first channel holes H1 that exposes the sacrificial layer 104 is formed and penetrates the stacked structure of the first inter-layer dielectric layers 110 and the first conductive layers 120, where the sacrificial layer 104 that is exposed through the pair of the first channel holes H1 is subsequently removed. Here, the sacrificial layer 104 may be removed through a wet etch process.

As a result of this process, the pair of the first channel holes H1 and a pipe channel hole H2 that couples the pair of the first channel holes H1 with each other under the pair of the first channel holes H1 are formed. The pair of the first channel holes H1 and a pipe channel hole H2 together form a U shape.

Figure 10:
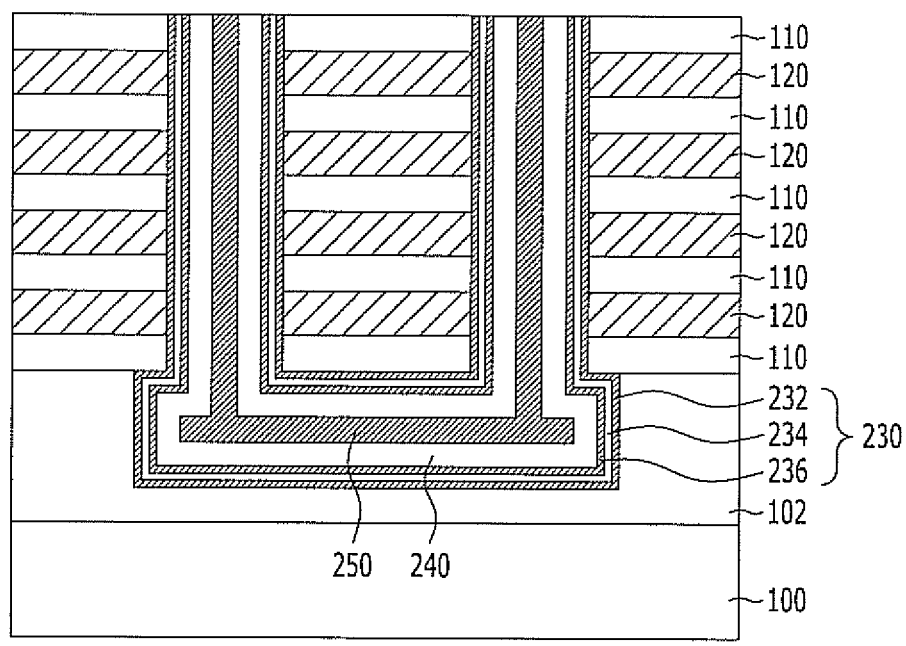

Referring to FIG. 10, a memory layer 230 having a triple layer structure of a charge blocking layer 232, a charge trapping layer 234, and a tunnel insulation layer 236 is formed along the internal walls of the pair of the first channel holes H1 and the pipe channel hole H2. Subsequently, a first channel 240 is formed over the memory layer 230 and the remaining space is subsequently filled with a first insulation layer 250. The memory layer 230, the first channel 240, and the first insulation layer 250 may be formed of the same material through the same process that the memory layer 130, the first channel 140, and the first insulation layer 150 are formed.

The subsequent processes that are substantially the same as the subsequent processes described with reference to FIGS. 2 to 4 are performed. More specifically, a second inter-layer dielectric layer 160, a second conductive layer 170, an anti-ion implantation layer 180, and a second inter-layer dielectric layer 160 are sequentially formed over the substrate structure shown in FIG. 10, and selectively etched to form a pair of second channel holes (not shown) that exposes the first channel 240 and the memory layer 230. Subsequently, a gate insulation layer 190 and a second channel 200 are formed in the inside of the second channel holes. The second channel 200 may be formed to not completely fill the second channel holes, where the space remaining after the formation of the second channel 200 may be filled with a second insulation layer 210. Subsequently, the second inter-layer dielectric layer 160 in the uppermost layer is removed, followed by formation of a second impurity doped region 204 formed on the surface of the upper portion of the second channel 200 and a final first impurity doped region 202' that surrounds the second impurity doped region 204 through the above-described first ion implantation process and second ion implantation process. As a result, the substrate structure illustrated in FIG. 11 may be obtained.

Figure 11:
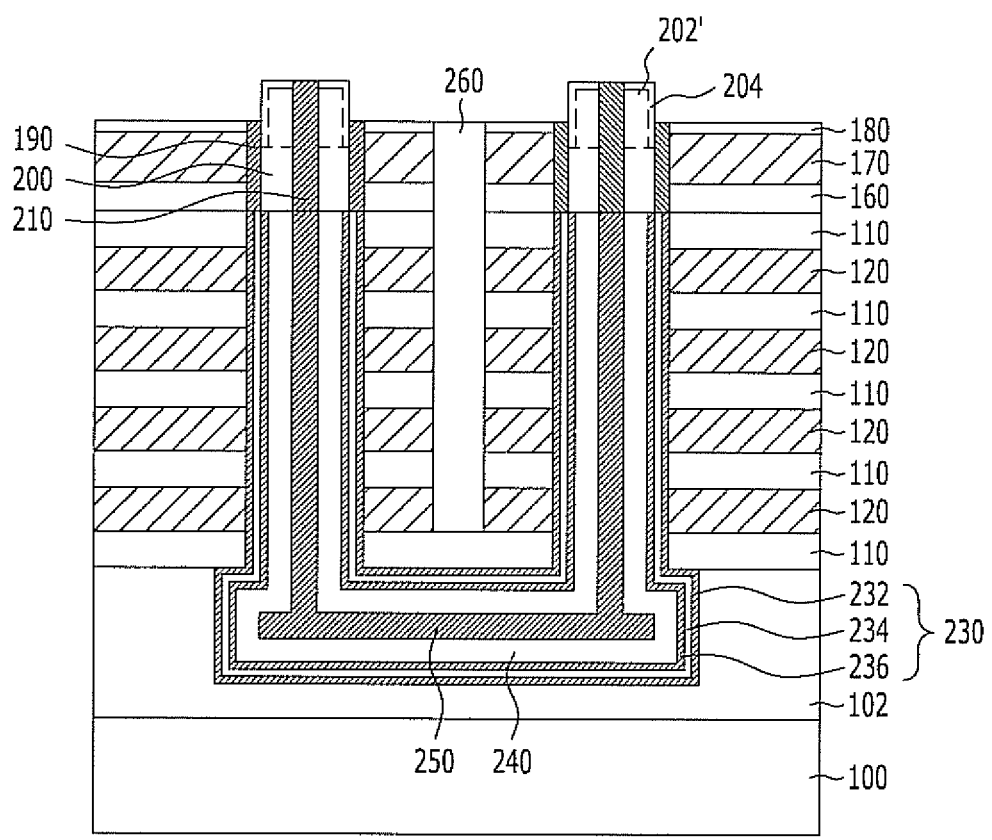

Referring to FIG. 11, a slit extending in a vertical direction and isolating the first conductive layers 120 and the second conductive layer 170 located between the pair of the first channel holes is formed by selectively etching the anti-ion implantation layer 180, the second conductive layer 170, the second inter-layer dielectric layer 160, the first inter-layer dielectric layers 110, and the first conductive layers 120 between the pair of the first channel holes. Here, the etch process for forming the slit may be performed using the lowermost first inter-layer dielectric layers 110 as an etch stop layer.

Subsequently, the slit is filled with a dielectric material 260.

Although not illustrated in the drawing, a process for forming a conductive pattern is performed similarly to what has been described with reference to FIGS. 5 and 6. Here, a conductive pattern (not shown) coupled with any one of a pair of second channels 200 may be a source line, and a conductive pattern (not shown) coupled with the other one of the pair of the second channels 200 may be a bit line.

Through the process described above, a non-volatile memory device which includes a pair of vertical channels, a plurality of memory cells stacked along each of the pair of the vertical channels, and a pipe channel transistor disposed under the pair of the vertical channels and coupling the pair of the vertical channels and has U-shaped memory strings may be fabricated. The fabricated non-volatile memory device and the method for fabricating the non-volatile memory device may obtain similar effects to those of the above-described embodiments.

Furthermore, the exemplary embodiments may be modified so as to change structures and methods as appropriate. For example, a structure having a first sacrificial layer (not shown) instead of the first conductive layers 120 shown in FIG. 8 may be formed, where the process for forming the channel holes H1 and H2 illustrated in FIG. 9 and the process for forming the memory layer 230 and the first channel 240 illustrated in FIG. 10 may be performed. Subsequently, the second inter-layer dielectric layer 160, a second sacrificial layer (not shown), the anti-ion implantation layer 180, and the second inter-layer dielectric layer 160 are sequentially stacked over the substrate structure, and further subsequent processes, which include a process for forming a pair of second channel holes, a process for forming a gate insulation layer 190 and the second channel 200, a process for forming the final first impurity doped region 202' and the second impurity doped region 204, and a process for forming the slit are performed. Thereafter, before the slit is filled with the dielectric material 260, the first and second sacrificial layers that are exposed through the slit are removed and the space from which the first and second sacrificial layers are removed is filled with a conductive material. Here, the slit is filled with the dielectric material 260 so as to obtain the structure illustrated in FIG. 11.

A non-volatile memory device and a fabrication method thereof in accordance with an embodiment of the present invention may generate a sufficient amount of holes for performing an erase operation and increase the speed of the erase operation.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
a channel that extends from a substrate in a vertical direction and comprises a first portion including an impurity doped region and a second portion disposed under the first portion; and
a plurality of memory cells and a selection transistor that are stacked over the substrate along the channel,
wherein the impurity doped region includes a second impurity doped region that forms a side surface and an upper surface of the first portion and a first impurity doped region that covers the second impurity doped region.

2. The non-volatile memory device of claim 1, wherein a bandgap energy of the second impurity doped region is lower than that of the first impurity doped region.

3. The non-volatile memory device of claim 1, wherein the second impurity doped region is in a more amorphous state compared to the first impurity doped region.

4. The non-volatile memory device of claim 1, wherein a first impurity of the first impurity doped region is an N-type impurity.

5. The non-volatile memory device of claim 1, wherein the channel is formed of a polycrystalline semiconductor material.

6. The non-volatile memory device of claim 5, wherein a second impurity of the second impurity doped region has a lower bandgap energy than the polycrystalline semiconductor material.

7. The non-volatile memory device of claim 1, wherein the channel is formed of polysilicon and the second impurity is formed of germanium.

8. The non-volatile memory device of claim 1, wherein a bottom surface of the first portion is disposed at a depth same as or lower than the upper surface of a gate of the selection transistor.

9. The non-volatile memory device of claim 8, further comprising:
an anti-ion implantation layer formed over the gate of the selection transistor.

10. The non-volatile memory device of claim 8, wherein a bottom surface of the first portion is disposed higher than the lower surface of a gate of the selection transistor.

11. The non-volatile memory device of claim 1, wherein the channel comprises a pair of channels and a coupling channel for coupling the pair of the channels,
wherein the coupling channel is disposed under the pair of the channels.

* * * * *